United States Patent
Chen

(10) Patent No.: US 10,896,997 B2
(45) Date of Patent: Jan. 19, 2021

(54) LIGHT-DIFFUSION QUANTUM DOT NANOSTRUCTURE WITH VOIDS AND LED COMPONENT HAVING THE SAME

(71) Applicant: National Tsing Hua University, Hsinchu (TW)

(72) Inventor: Hsueh-Shih Chen, Hsinchu (TW)

(73) Assignee: National Tsing Hua University

( * ) Notice: Subject to any disclaimer, the term of this patent is extended or adjusted under 35 U.S.C. 154(b) by 152 days.

(21) Appl. No.: 15/799,463

(22) Filed: Oct. 31, 2017

(65) Prior Publication Data

US 2018/0315898 A1    Nov. 1, 2018

(30) Foreign Application Priority Data

Apr. 26, 2017   (TW) .............................. 106113903 A

(51) Int. Cl.
  *H01L 33/50*   (2010.01)
  *H01L 33/64*   (2010.01)
  (Continued)

(52) U.S. Cl.
  CPC .......... *H01L 33/502* (2013.01); *B82Y 40/00* (2013.01); *H01L 33/501* (2013.01); *H01L 33/64* (2013.01); *B82Y 20/00* (2013.01); *H01L 33/486* (2013.01); *H01L 33/56* (2013.01); *H01L 33/58* (2013.01); *H01L 33/62* (2013.01); *H01L 33/642* (2013.01); *H01L 2933/0041* (2013.01); *H01L 2933/0083* (2013.01); *Y10S 977/774* (2013.01); *Y10S 977/779* (2013.01); *Y10S 977/78* (2013.01); *Y10S 977/783* (2013.01);
  (Continued)

(58) Field of Classification Search
  CPC ....... C09K 11/025; C09K 11/02; C09K 11/08; H01L 33/502; H01L 2933/0041; H01L 33/56; H01L 33/50; B82Y 30/00; B82Y 20/00; B82Y 40/00; Y10S 977/774; Y10S 977/95; G01N 33/588
  USPC ......... 257/13, 98, E21.09, E33.008; 977/774
  See application file for complete search history.

(56) References Cited

U.S. PATENT DOCUMENTS

| | | | |
|---|---|---|---|
| 2008/0127856 A1* | 6/2008 | Hasinovic | C09G 1/12 106/10 |
| 2011/0068322 A1* | 3/2011 | Pickett | C09K 11/02 257/13 |

(Continued)

*Primary Examiner* — David Chen

(57) ABSTRACT

The present invention discloses a light-diffusion quantum dot nanostructure and an LED component having the same. The quantum dot nanostructure comprises an optical core, an organic ligand layer, a hydrophobic layer, an inorganic encapsulation layer, and a multi-layered water vapor barrier layer. In the present invention, the multi-layered water vapor barrier layer is particularly designed to an onion skin-like structure, so as to facilitate photoluminescence rays radiated from the optical core can emit out of the barrier layer via voids or pores of the onion skin-like structure, such that the uniformity of the spatial light output distribution of the LED component having the quantum dot nanostructures can be obviously enhanced. On the other hand, because the multi-layered water vapor barrier layer can also improve the dispersibility of the light-diffusion quantum dot nanostructures in a colloidal encapsulation of the LED component, the luminous intensity of the LED component is therefore increased.

18 Claims, 13 Drawing Sheets

(51) Int. Cl.
- *B82Y 40/00* (2011.01)
- *B82Y 20/00* (2011.01)
- *H01L 33/56* (2010.01)
- *H01L 33/58* (2010.01)
- *H01L 33/62* (2010.01)
- *H01L 33/48* (2010.01)

(52) U.S. Cl.
CPC ........ *Y10S 977/815* (2013.01); *Y10S 977/824* (2013.01); *Y10S 977/835* (2013.01); *Y10S 977/95* (2013.01)

(56) References Cited

U.S. PATENT DOCUMENTS

| | | | |
|---|---|---|---|
| 2014/0061503 A1* | 3/2014 | Lee | C09K 11/7734 250/458.1 |
| 2014/0264196 A1* | 9/2014 | Werner | C23C 16/30 252/519.34 |

* cited by examiner

LIGHT-DIFFUSION QUANTUM DOT NANOSTRUCTURE WITH VOIDS AND LED COMPONENT HAVING THE SAME

BACKGROUND OF THE INVENTION

1. Field of the Invention

The present invention relates to the technology field of quantum dots, and more particularly to a light-diffusion quantum dot nanostructure and an LED component having the same.

2. Description of the Prior Art

Light plays a significant role for a very long time in human life. Accompanying with the constant progresses of science and technology, LED (Light Emitting Diode) has been invented in 1970s. With the advantages of compact size, long lifetime, low breakage, low power consumption, and no toxic pollution, LED is now broadly utilized in our daily life.

With reference to FIG. 1, there is a cross-sectional profile diagram of a traditional LED component. Moreover, please simultaneously refer to FIG. 2, which illustrates a cross-sectional side view of the traditional LED component. According to FIG. 1 and FIG. 2, it is able to know that the traditional LED component 1' comprises: an electrical insulation body 11', a lead frame 12', a heat sink 13', a colloidal encapsulation 14', a lens 15', and an LED chip 16', wherein the colloidal encapsulation 14' is doped with at least one wavelength conversion material such as phosphor 17'. Engineers skilled in development and manufacture of the LED component 1' should know that, after electrically driving the LED chip 16' to emit a blue light or a UV light for irradiating the phosphor 17', a colored light radiated from the phosphor 17' subsequently mixes with the blue light or the UV light such that a white light is produced.

In spite of the fact that manufacturing technologies of traditional LED components have been well developed, traditional LED components always include drawbacks coming from the thermal instability and the reabsorption effect of the phosphor doped in the colloidal encapsulation. Accordingly, quantum dot light emitting diode (QD-LED) component is therefore be developed and proposed. FIG. 3 shows a cross-sectional side view of a QD-LED component, wherein the QD-LED component 10' comprises: an electrical insulation body 101', a lead frame 102', a heat sink 103', a QD encapsulant 104', a lens 105', and an LED chip 106'. As FIG. 3 shows, the QD encapsulant 104' is constituted by a colloidal encapsulation 1041', a plurality of first QDs 1042', and a plurality of second QDs 1043'. Moreover, it is worth explaining that, since the QDs (1042', 1043') have a particle size in a range of 5-20 nm or 2-10 nm, the first QDs 1042' and the second QDs 1043' would respectively emit a red light and a green light under the irradiation of a short-wavelength light produced by the LED chip 106'; eventually, the QD-LED component 10' radiates a white light mixed by the red light, the green light and the short-wavelength light.

On the other hand, conjugation of hydrophobic shells/molecules (such as silica) on the surface of QDs (1042', 1043') is now adopted for enhancing the stability of the QDs. Moreover, in order to stimulate the production of photoluminescent lights of the QDs (1042', 1043'), a plurality of scattering particles 1044' are integrated into the colloidal encapsulation 1041', such as TiO$_2$ particles, BaSO$_4$ particles, MgO particles, SiO$_2$ particles, and Al$_2$O$_3$ particles. FIG. 4 illustrates schematic optical paths of scattering lights of the short-wavelength light and the photoluminescent light. From FIG. 4, it is found that, even though the adding of the scattering particles 1044' can largely enhance the production of photoluminescent lights of the QDs (1042', 1043'), the light-outcoupling efficiency of the QD-LED component 10' may be reduced due to the block effect of the scattering particles 1044' to the photoluminescent lights.

Continuously referring to FIG. 5 and FIG. 6, wherein FIG. 5 shows a curve plot of wavelength versus photoluminescence (PL) intensity and FIG. 6 presents a CIE 1931 chromaticity diagram. From FIG. 5, it is easy to understand that the UV light emitted by the LED chip 106' does excel the photoluminescent lights (red light and green light) radiated from the QDs (1042', 1043') in luminous intensity, and that causes the QD-LED component 10' perform a not good spatial light output distribution. Moreover, it is worth noting that, the white light emitted by the QD-LED component 10' has a color temperature exceeding 10000 K because the chromaticity coordinate of the white light is at (0.2143, 0.2529).

Thus, in view of the fact that white light radiated by the conventional QD-LED component 10' shows the drawbacks of un-uniform spatial light output distribution and over-high color temperature, the inventors of the present application have made great efforts to make inventive research thereon and eventually provided a light-diffusion quantum dot nanostructure and an LED component having the same.

SUMMARY OF THE INVENTION

The primary objective of the present invention is to provide a light-diffusion quantum dot nanostructure and an LED component having the same. The quantum dot nanostructure comprises an optical core, an organic ligand layer, a hydrophobic layer, an inorganic encapsulation layer, and a multi-layered water vapor barrier layer. In the present invention, the multi-layered water vapor barrier layer is particularly designed to an onion skin-like structure, so as to facilitate photoluminescence rays radiated from the optical core can emit out of the barrier layer via voids or pores of the onion skin-like structure, such that the uniformity of the spatial light output distribution of the LED component having the quantum dot nanostructures can be obviously enhanced. On the other hand, because the multi-layered water vapor barrier layer can also improve the dispersibility of the light-diffusion quantum dot nanostructures in a colloidal encapsulation of the LED component, the luminous intensity of the LED component is therefore increased.

In order to achieve the primary objective of the present invention, the inventor of the present invention provides an embodiment for the light-diffusion quantum dot nanostructure, comprising:

an optical core;

an organic ligand layer, being made of at least one organic ligand material and covering the optical core;

a hydrophobic layer, being made of at least one hydrophobic material, wherein the hydrophobic material conjugates with the organic ligand material through facile ligand exchange reactions, so as to facilitate the hydrophobic layer cover the organic ligand layer;

an inorganic encapsulation layer, covering the hydrophobic layer; and a multi-layered water vapor barrier layer, having an onion skin-like structure constituted by a plurality of concentric spherical shells, and covering the inorganic encapsulation layer.

In the embodiment of the light-diffusion quantum dot nanostructure, there are several voids forming between the concentric spherical shells of the onion skin-like structure.

In the embodiment of the light-diffusion quantum dot nanostructure, the manufacturing material of the concentric spherical shell is selected from the group consisting of silica gel, polysiloxane resin and metal oxide.

Moreover, for achieving the primary objective of the present invention, the inventor of the present invention further provides an embodiment for the LED component, comprising:

an insulation body, being provided with a recess;
a lead frame, being disposed in the insulation body and having at least two welding portions and at least two electrical connection portions, wherein the welding portions locate in the recess and the electrical connection portions extend out of the insulation body;
an LED chip, being disposed in the recess and electrically connected to the welding portions, used for emitting a first colored light with a first wavelength; a colloidal encapsulation, being filled into the recess for enclosing the LED chip and the welding portions; and
a plurality of clusters of light-diffusion quantum dot nanostructures, being spread in the colloidal encapsulation, wherein each of the light-diffusion quantum dot nanostructures comprises:
an optical core, being used for converting the first colored light to a second colored light with a second wavelength, wherein the second wavelength is longer than the first wavelength;
an organic ligand layer, being made of at least one organic ligand material and covering the optical core;
a hydrophobic layer, being made of at least one hydrophobic material, wherein the hydrophobic material conjugates with the organic ligand material through facile ligand exchange reactions, so as to facilitate the hydrophobic layer cover the organic ligand layer;
an inorganic encapsulation layer, covering the hydrophobic layer; and a multi-layered water vapor barrier layer, having an onion skin-like structure constituted by a plurality of concentric spherical shells, and covering the inorganic encapsulation layer.

In the embodiment of the LED component, a heat sink is further disposed in the insulation body and has an LED contacting portion and a heat dissipating portion, wherein the LED contacting portion locates in the recess for contacting the LED chip, and the heat dissipating portion extends out of the insulation body.

In the embodiment of the LED component, a lens is disposed on the top of the insulation body for covering the recess.

In the embodiment of the LED component, there are several voids forming between the concentric spherical shells of the onion skin-like structure, and the manufacturing material of the concentric spherical shell is selected from the group consisting of silica gel, polysiloxane resin and metal oxide.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a light-diffusion quantum dot nanostructure and an LED component having the light-diffusion quantum dot nanostructure according to the present invention, embodiments of the present invention will be described in detail with reference to the attached drawings hereinafter.

Embodiment of the Light-Diffusion Quantum Dot Nanostructure

Figure 7:
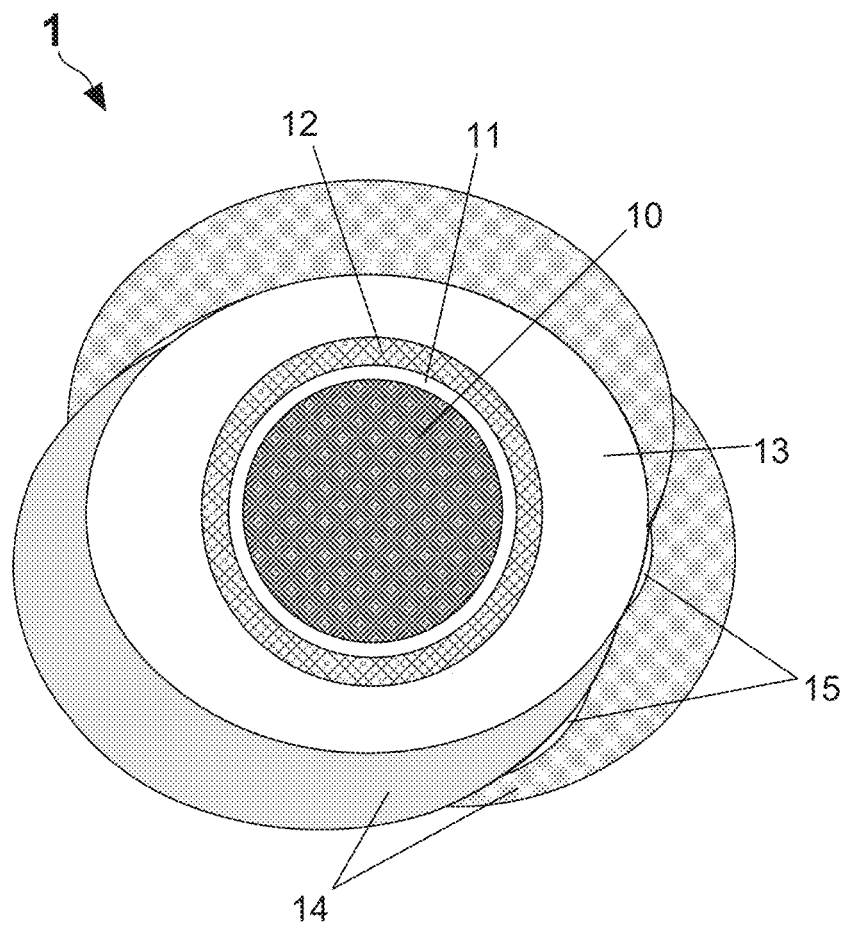
FIG. 7 shows a cross-sectional side view of a light-diffusion quantum dot nanostructure according to the present invention.

With reference to FIG. 7, there is provided a cross-sectional side view of a light-diffusion quantum dot nanostructure according to the present invention. As FIG. 7 shows, the light-diffusion quantum dot nanostructure 1 comprises: an optical core 10, an organic ligand layer 11, a hydrophobic layer 12, an inorganic encapsulation layer 13, and a multi-layered water vapor barrier layer 14, wherein the optical core is a quantum dot made of at least one semiconductor material selected from the group consisting of Group II-VI compounds, Group III-V compounds, Group II-VI compounds having core-shell structure, Group III-V compounds having core-shell structure, Group II-VI compounds having non-spherical alloy structure, and combination of the aforesaid two or above compounds. Moreover, different exemplary materials for the quantum dot are listed in following Table (1).

TABLE (1)

| Compounds | Exemplary materials |
| --- | --- |
| Group II-VI compounds | CdSe or CdS |
| Group III-V compounds | (Al, In, Ga)P, (Al, In, Ga)As, or (Al, In, Ga)N |
| Group III-V compounds having core-shell structure | CdSe/ZnS core-shell QD |

TABLE (1)-continued

| Compounds | Exemplary materials |
|---|---|
| Group III-V compounds having core-shell structure | InP/ZnS core-shell QD |
| Group II-VI compounds having non-spherical alloy structure | ZnCdSeS |

In spite of the materials of the quantum dot are listed in Table (1), that does not used for approaching a limitation in use of the manufacturing materials of the quantum dot (i.e., the optical core 10). On the other hand, engineers skilled in development and manufacture of quantum dots should know that, color modulation of QD photoluminescence can be achieved by controlling the size of the synthesized QDs designedly. The colors of a photoluminescent light radiated from the QDs corresponding to different QD sizes are integrated in following Table (2).

TABLE (2)

| Colors of photoluminescent light | Size of QD (nm) |
|---|---|
| Blue-green | 2-7 |
| Green | 3-10 |
| Yellow | 4-12 |
| Orange | 4-14 |
| Red | 5-20 |

On the other hand, as FIG. 7 shows, the organic ligand layer 11 is made of at least one organic ligand material and covering the optical core 10, which is used for carrying out a surface modification or a size effect to the optical core 10. The organic ligand material is selected from the group consisting of alkyl phosphines, phosphine oxides, phosphonic acids, organic compounds having thiol group, organic compounds having amine group, and carboxylic acids. Moreover, different exemplary materials for the organic ligand material are listed in following Table (3).

TABLE (3)

| Types of organic ligand material | Exemplary materials |
|---|---|
| Alkyl phosphine | Trioctyl phosphine (TOP) |
| Phosphine oxide | Trioctylphosphine oxide (TOPO) |
| Phosphonic acid | octadecylphosphonic acid (ODPA) |
| Organic compounds having thiol group | Mercaptopropionic acid (MPS), 1,8-octanedithiol (ODT), thioglycolic acid (TGA), dithiodipropionic acid (DTDPA). |
| Organic compounds having amine group | Hexadecylamine (HDA), trimethylamine (TMA), d-penicillamine (DPA). |
| carboxylic acids | Oleic acid (OA), dihydrolipoic acid (DHLA), thioctic acid (TA), acetic acid (AA) |

Engineers skilled in development and manufacture of QDs should know that, conjugation of hydrophobic shells/molecules (i.e., the hydrophobic layer 12) on the surface of QD (i.e., the optical core 10) is usually adopted for enhancing the stability of the QD. In the present invention, the manufacturing material of the hydrophobic layer 12 is selected from the group consisting of 3-mercaptopropyltrimethoxysilane (3-MPS), 3-aminopropyltriethoxysilane (APTMS), 3-(trimethoxysilyl) propylmethacrylate (TMOPMA), and 3-trimethoxysilylpropanethiol (MPTMS).

Furthermore, the hydrophobic layer 12 is covered by an inorganic encapsulation layer 13, which is mainly used for preventing the optical core 10 from being suffered with photooxidation, and can be made of tetraethoxysilane (TEOS) or tetramethyl orthosilicate (TMOS).

It is worth noting that, the inorganic encapsulation layer 13 enclosing the QD (i.e., the optical core 10) would reduce the dispersibility of the quantum dot nanostructure in a polymer solidified material, such as a colloidal encapsulation of an LED component. For this reason, the present invention particularly designs a multi-layered water vapor barrier layer 14 for covering the inorganic encapsulation layer 13, wherein the multi-layered water vapor barrier layer 14 has an onion skin-like structure constituted by a plurality of concentric spherical shells. The concentric spherical shell is made of silica gel, polysiloxane resin or metal oxide. Moreover, different exemplary materials for the metal oxide are listed in following Table (4).

TABLE (4)

| Types of metal oxide | Exemplary materials |
|---|---|
| Metal oxide having single kind of metal element | $Al_2O_3$, $TiO_2$ |
| Metal oxide having multiple kinds of metal element | SrTiO (STO), $BaTiO_3$ (BTO) |

Of course, the said multi-layered water vapor barrier layer 14 having onion skin-like structure can be constituted by the concentric spherical shells made of different materials. For example, the onion skin-like structure can be constituted by polysiloxane resin-made concentric spherical shells and STO-made concentric spherical shells. On the other hand, the said multi-layered water vapor barrier layer 14 having onion skin-like structure can also be constituted by the concentric spherical shells made of an identical material. Moreover, according to FIG. 7, it is found that there are several voids 15 forming between the concentric spherical shells of the multi-layered water vapor barrier layer 14 having onion skin-like structure.

Fabrication of the Light-Diffusion Quantum Dot Nanostructure

The above-introduced light-diffusion quantum dot nanostructure 1 can be produced by using following manufacturing process steps:

Step (1): dispersing 5-mg quantum dots in a non-polar solution such as 3-mL toluene, wherein each of the quantum dots (QDs) comprises an optical core 10 and an organic ligand layer 11;

Step (2): adding a deprotonation agent and a silicon-based monomer solution into the non-polar solution, and then stirring the non-polar solution under room temperature for 5 minutes, wherein the silicon-based monomer solution is 0.3-mL silicon-based monomer solution and the deprotonation agent is 0.1-mL TMAH (Tetramethyl ammnium hydroxide);

Step (3): adding 20-mL methanol and a TEOS solution of 0.1 mL into the solution obtained from the step (2) and having a plurality of surface-silanized ODs, and then controlling the densify of an inorganic encapsulation layer 13 enclosing the QDs by diluting the solution;

Step (4): repeating the step (3) for 3-5 times;

Step (5): adding 0.1-mL TTIP (titanium isopropoxide) solution and 20-mL propanol into the solution obtained from the step (4), and then controlling the densify of a multi-layered water vapor barrier layer 14 enclosing the inorganic encapsulation layer 13 and the QDs by diluting the solution; and Step (6): repeating the step (5) for 3-5 times.

Figure 4:
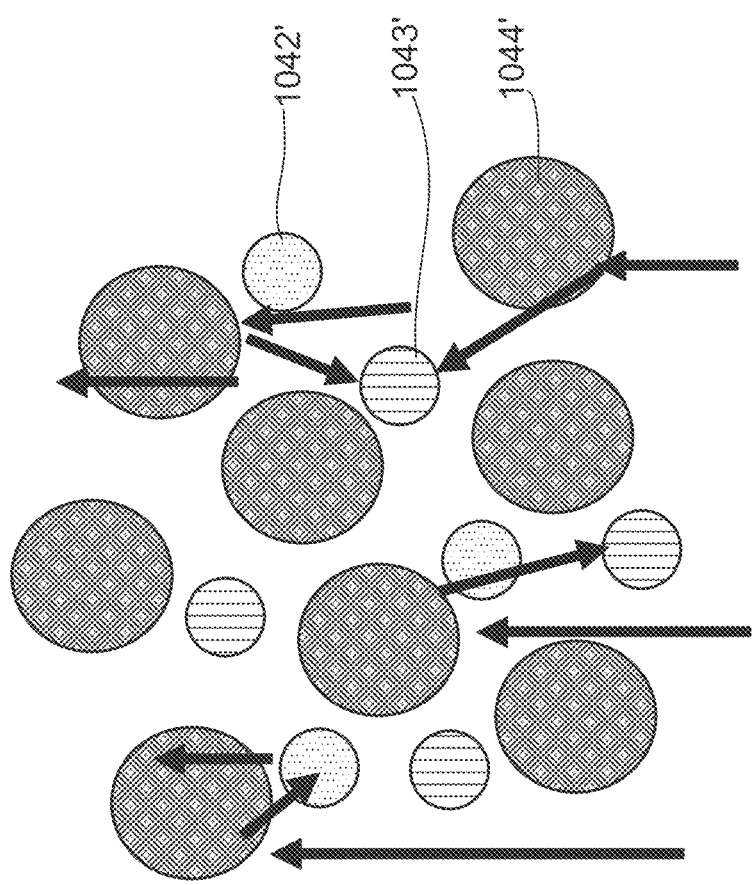
FIG. 4 shows schematic optical paths of scattering lights of a short-wavelength light and photoluminescent lights.
Figure 5:
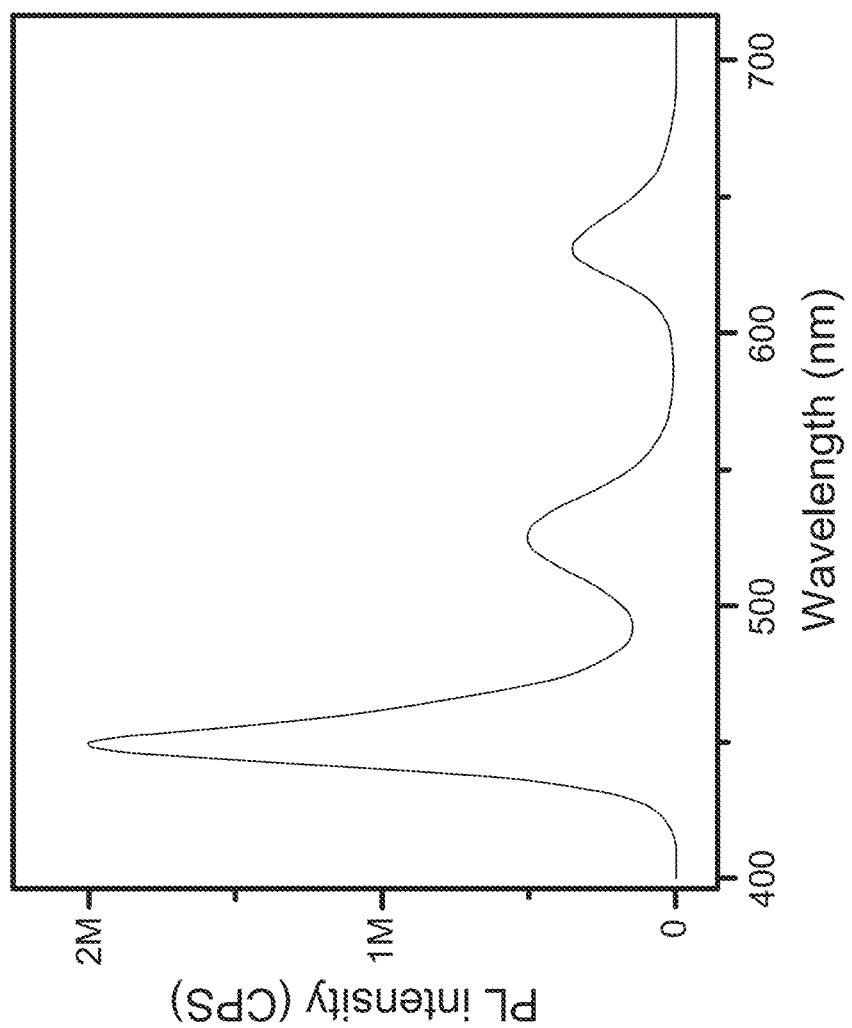
FIG. 5 shows a curve plot of wavelength versus photoluminescence (PL) intensity.
Figure 6:
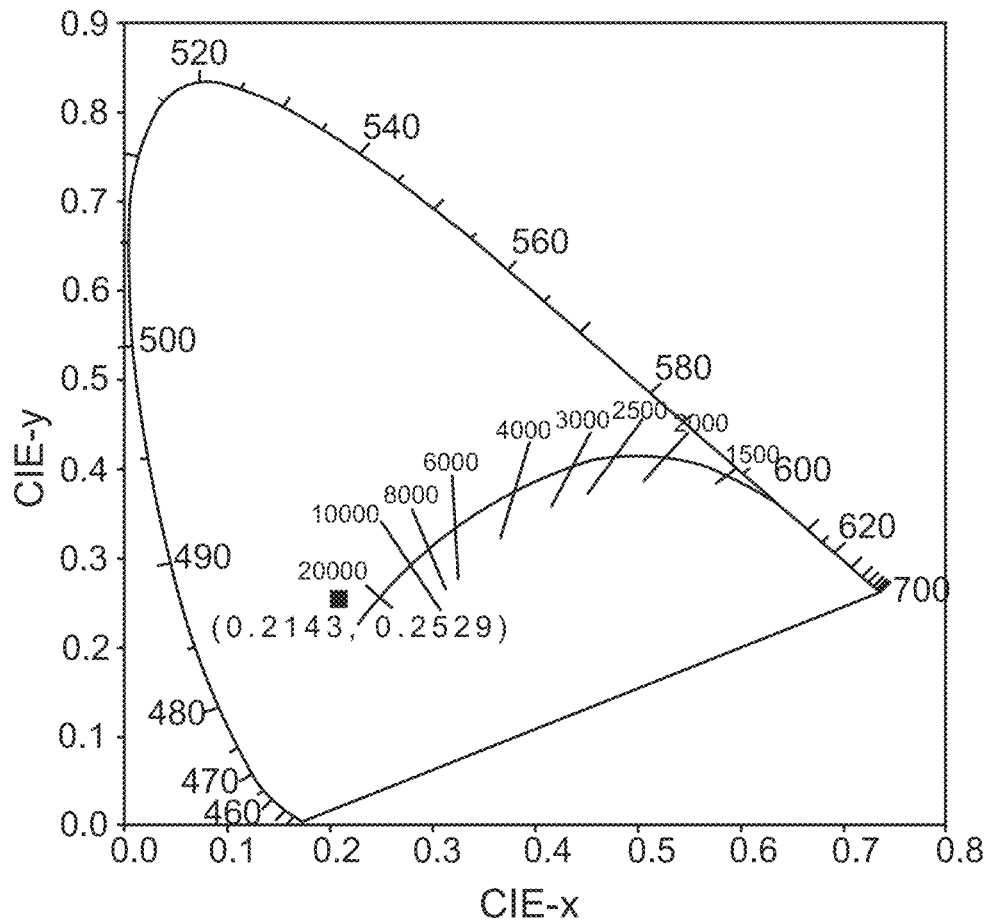
FIG. 6 shows a CIE 1931 chromaticity diagram.
Figure 8:
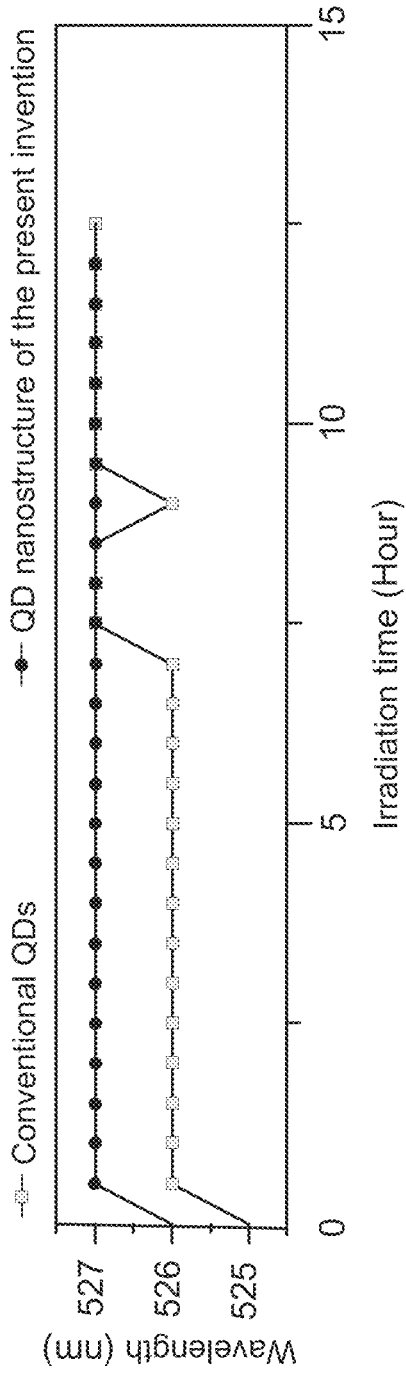
FIG. 8 shows a data curve plot of irradiation time versus wavelength of irradiation light.
Figure 9:
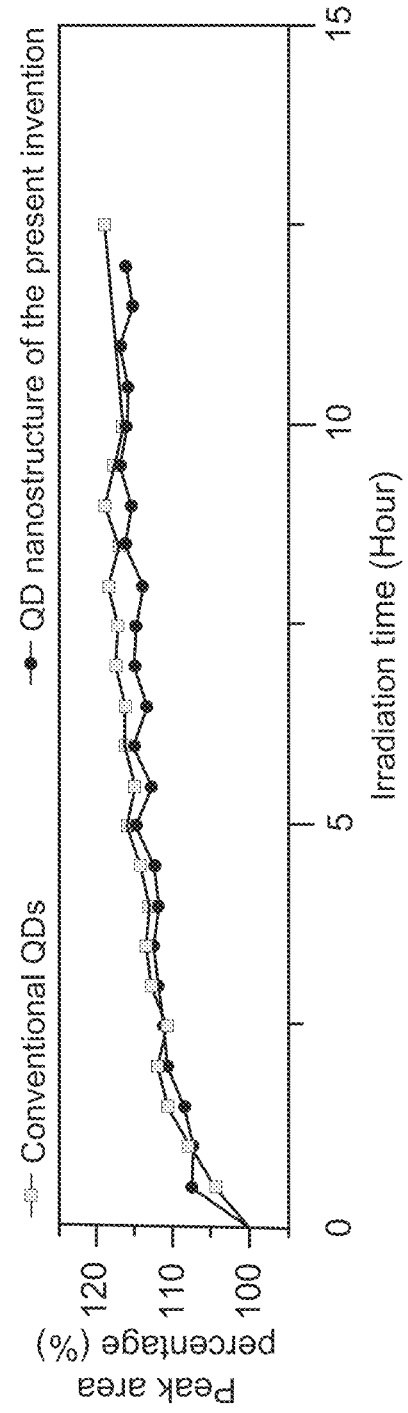
FIG. 9 shows a data curve plot of irradiation time versus X-ray photoelectron spectra (XPS) peak area percentage.
Figure 10:
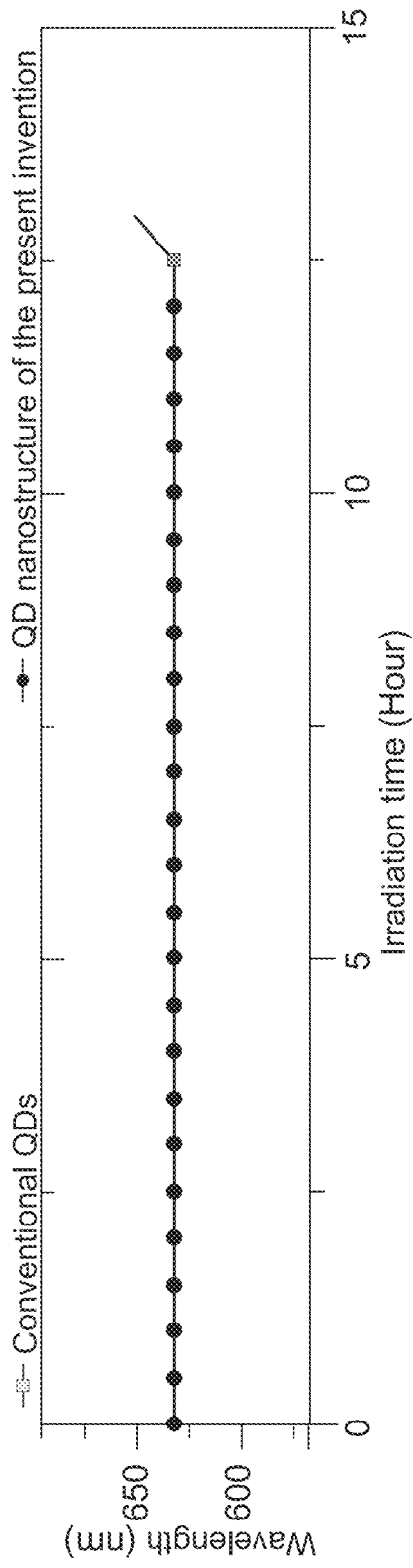
FIG. 10 shows a data curve plot of irradiation time versus wavelength of irradiation light.
Figure 11:
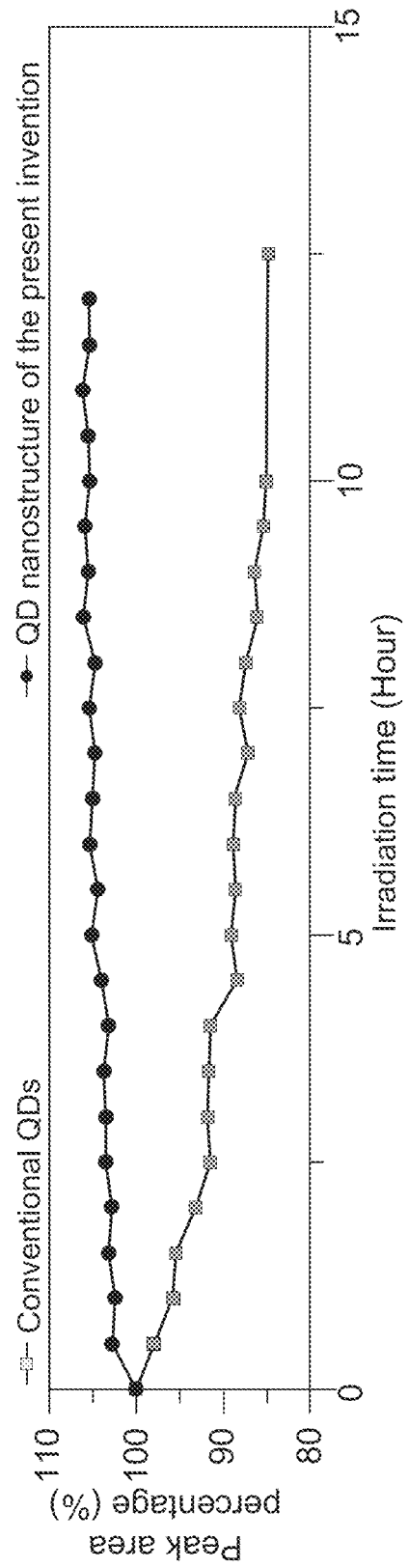
FIG. 11 shows a data curve plot of irradiation time versus X-ray photoelectron spectra (XPS) peak area percentage.

Please refer to FIG. 8, which illustrate a data curve plot of irradiation time versus wavelength of irradiation light. Moreover, FIG. 9 shows a data curve plot of irradiation time versus X-ray photoelectron spectra (XPS) peak area percentage. It needs to explain that the "conventional QDs" marked in FIG. 8 and FIG. 9 means the second QDs 1043' shown in FIG. 4, and the particle size of the optical core 10 of the "QD nanostructure 1 of the present invention" is controlled in a range from 3 nm to 10 nm. On the other hand, Please refer to FIG. 10, which illustrate a data curve plot of irradiation time versus wavelength of irradiation light. Moreover, FIG. 11 shows a data curve plot of irradiation time versus X-ray photoelectron spectra (XPS) peak area percentage. In FIG. 10 and FIG. 11, the "conventional QDs" marked means the first QDs 1042' shown in FIG. 4, and the particle size of the optical core 10 of the "QD nanostructure 1 of the present invention" is controlled in a range from 5 nm to 20 nm. From FIG. 8, FIG. 9, FIG. 10, and FIG. 11, it can find that QD nanostructures of the present invention exhibit better stability comparing to conventional QDs.

Figure 12:
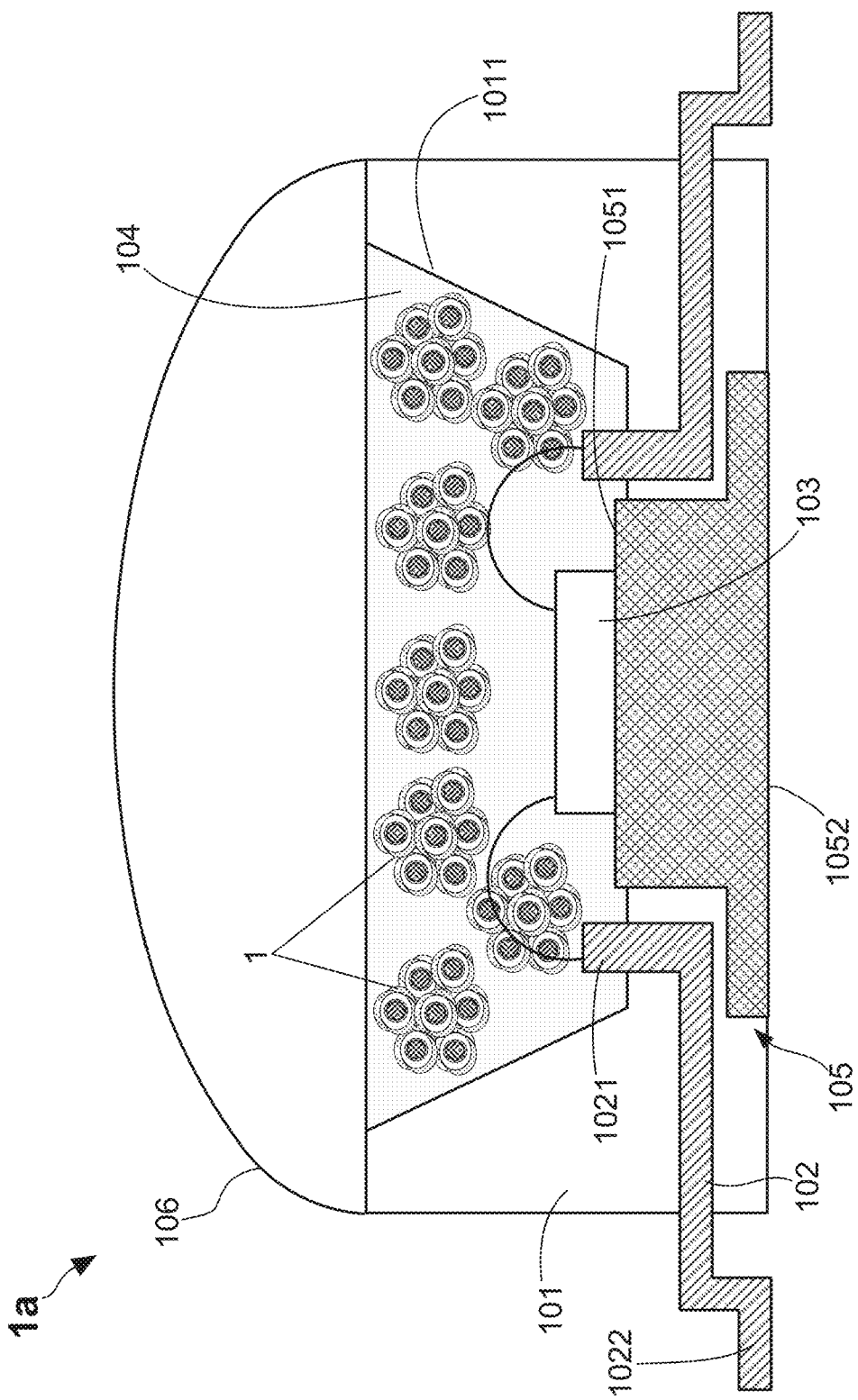
FIG. 12 shows a cross-sectional side view of an LED component according to the present invention.
Figure 13:
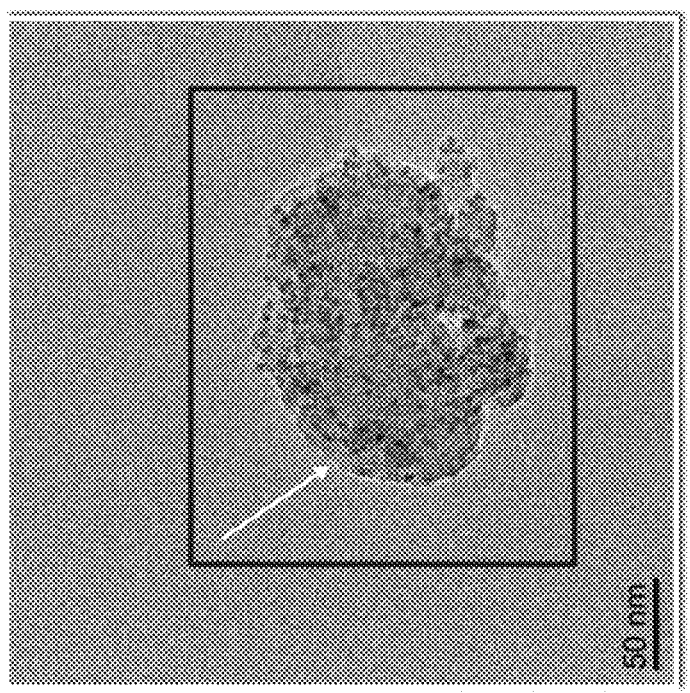
FIG. 13 shows an HRTEM image of clusters of the light-diffusion quantum dot nano structures.

Embodiment of the LED Component Having the Light-Diffusion Quantum Dot Nanostructures With reference to FIG. 12, there is provided a cross-sectional side view of an LED component according to the present invention. As FIG. 12 shows, the LED component 1a comprises: an insulation body 101, a lead frame 102, an LED chip 103, a colloidal encapsulation 104, and a plurality of clusters of light-diffusion quantum dot nanostructures 1. FIG. 13 shows an HRTEM image of the said clusters of the light-diffusion quantum dot nanostructures 1, and the HRTEM means "High-resolution transmission electron microscopy".

According to FIG. 12, it is able to know that the insulation body 101 is provided with a recess 1011, and the lead frame 102 is disposed in the insulation body 101, wherein the lead frame 102 comprises at least two welding portions 1021 and at least two electrical connection portions 1022; moreover, the welding portions 1021 locate in the recess 1011 and the electrical connection portions 1022 extend out of the insulation body 101. On the other hand, the LED chip 103 is disposed in the recess 1011 and electrically connected to the welding portions 1021, which is able to emit a first colored light with a first wavelength, such as ultraviolet light, purple-blue light, blue light, or combination of above two or more colored lights.

Moreover, the colloidal encapsulation 104 is filled into the recess 1011 for enclosing the LED chip 103 and the welding portions 1021, wherein the manufacturing material of the colloidal encapsulation 104 is selected from the group consisting of silicone, silica gel, polymethylmethacrylate (PMMA), polycarbonate (PC), polyvinyl chloride (PVC), polystyrene (PS), polyethylene terephthalate (PET), and epoxy resin. On the other hand, the said clusters of light-diffusion quantum dot nanostructures 1 are spread in the colloidal encapsulation 104. As FIG. 7 shows, each of the light-diffusion quantum dot nanostructures 1 comprises: an optical core 10, an organic ligand layer 11, a hydrophobic layer 12, an inorganic encapsulation layer 13, and a multi-layered water vapor barrier layer 14. Herein, it needs emphasize that, the present invention does not particularly limit the types of the LED chips 103 and the optical core 10 in the quantum dot nanostructure 1. Different exemplary selections for the types of the LED chips 103 and the optical core 10 are shown in following Table (5).

TABLE (5)

| Types of LED chip | Types of optical core |
|---|---|
| Blue LED chip | Yellow QDs |
| Blue LED chip | Combination of green QDs and red QDs |
| Purple-blue Blue LED chip | Combination of blue-green QDs, green QDs and red QDs |

For instance, after electrically driving the blue LED chip to emit a blue light for irradiating the optical cores 10 comprising green QDs and red QDs, green light and red light radiated from the optical cores 10 would subsequently mix with the blue light in the colloidal encapsulation 104, therefore a white light is produced. Moreover, according to FIG. 12, it is found that a lens 106 is disposed on the top of the insulation body 101 for covering the recess 1011 and a heat sink 105 is disposed in the insulation body 101. Wherein the heat sink 105 comprises an LED contacting portion 1051 and a heat dissipating portion 1052; moreover, the LED contacting portion 1051 locates in the recess 1011 for contacting the LED chip 103, and the heat dissipating portion 1052 extends out of the insulation body 101.

Figure 1:
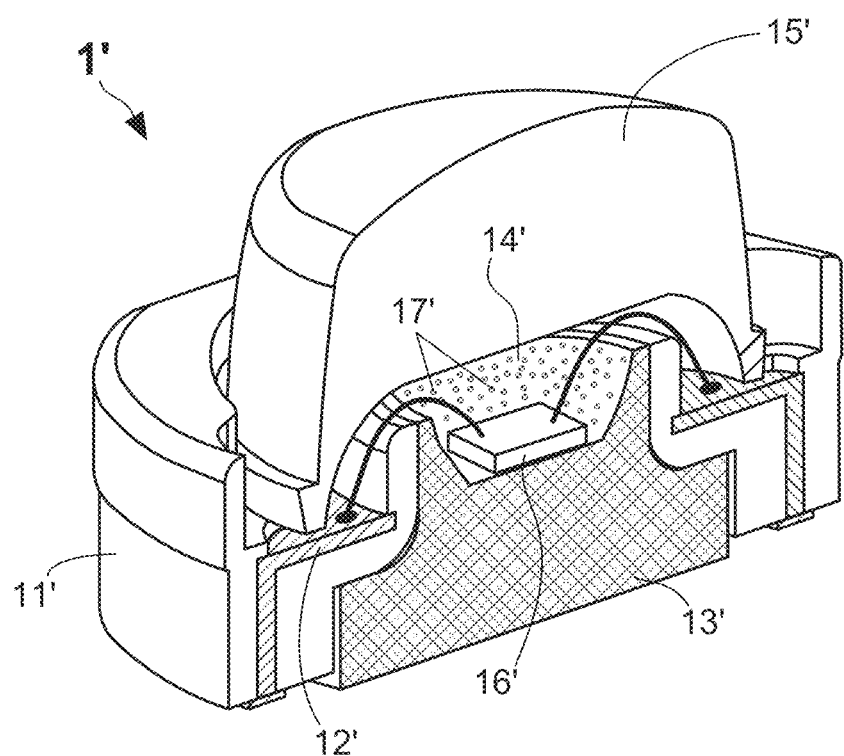
FIG. 1 shows a cross-sectional profile diagram of a traditional LED component.
Figure 2:
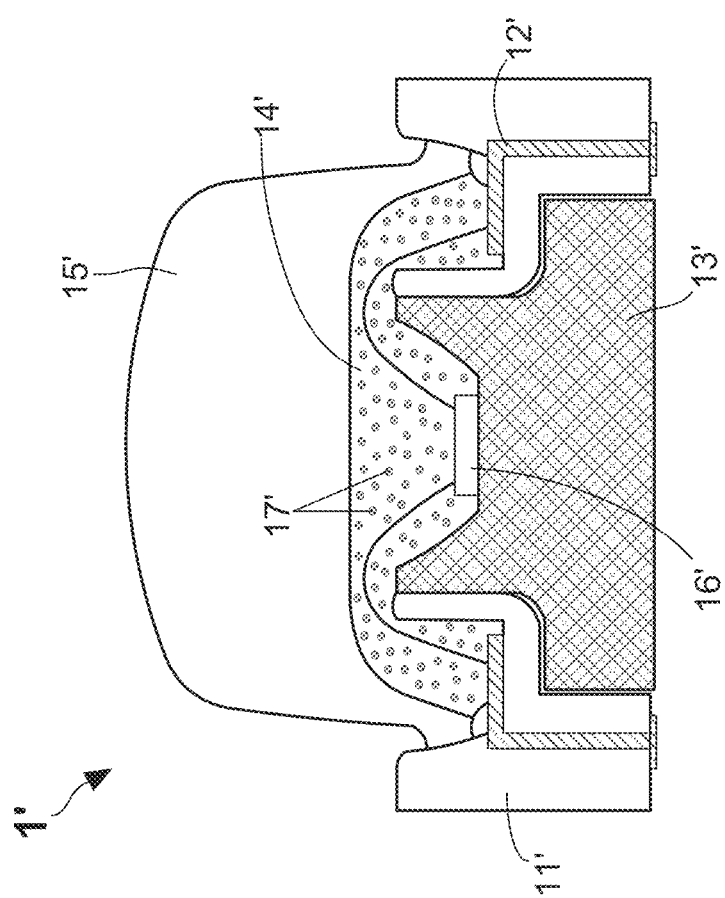
FIG. 2 shows a cross-sectional side view of the traditional LED component.
Figure 3:
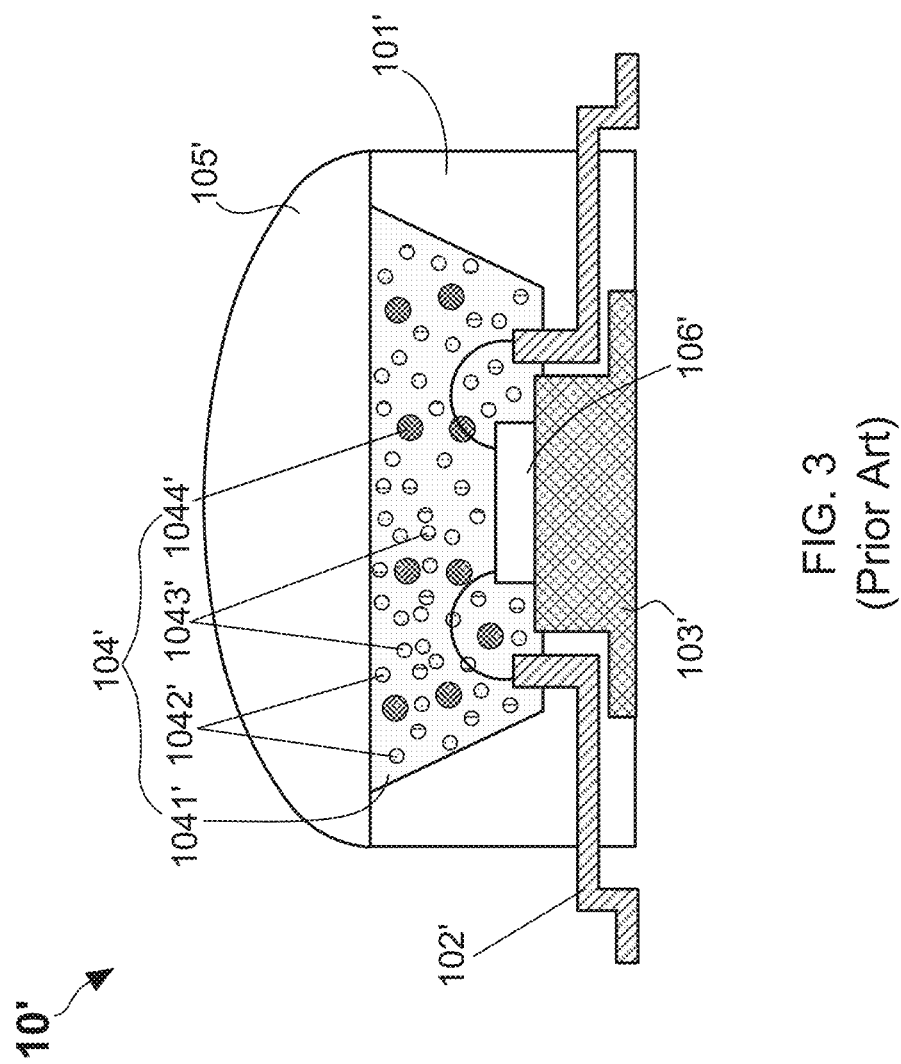
FIG. 3 shows a cross-sectional side view of a QD-LED component.
Figure 14:
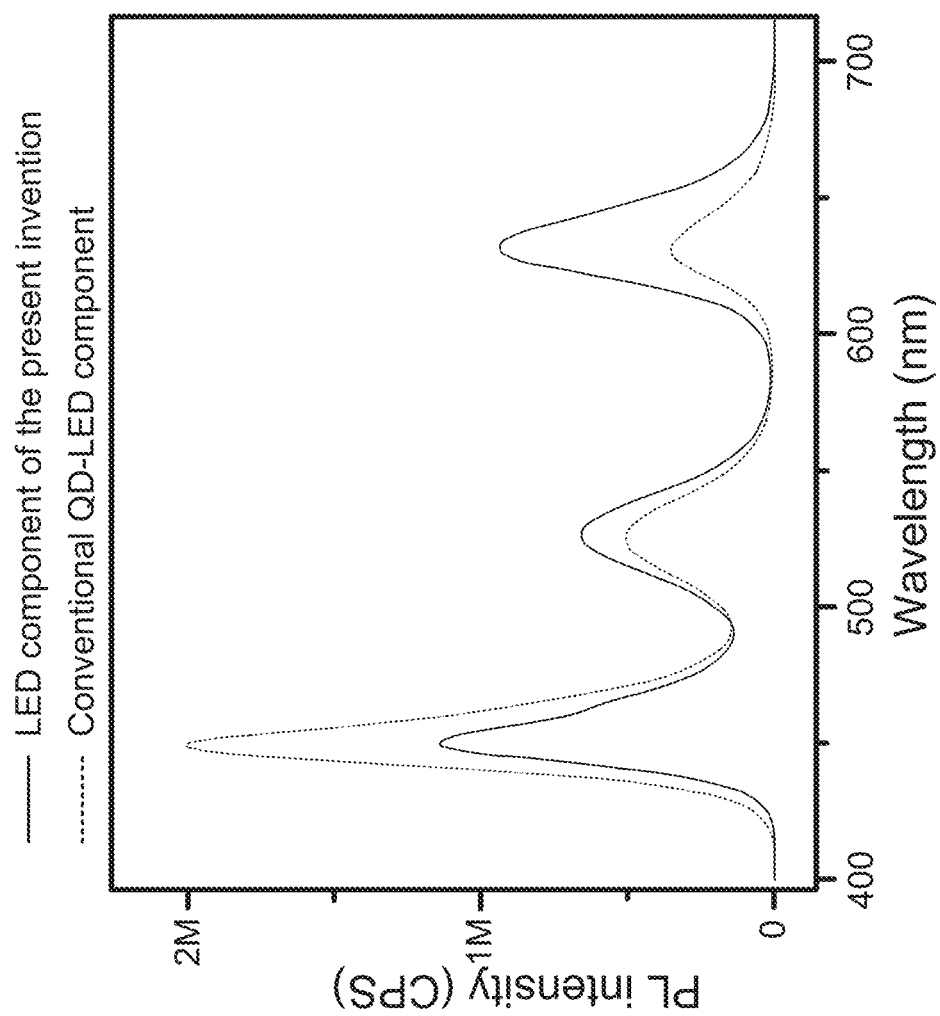
FIG. 14 shows a curve plot of wavelength versus photoluminescence (PL) intensity.
Figure 15:
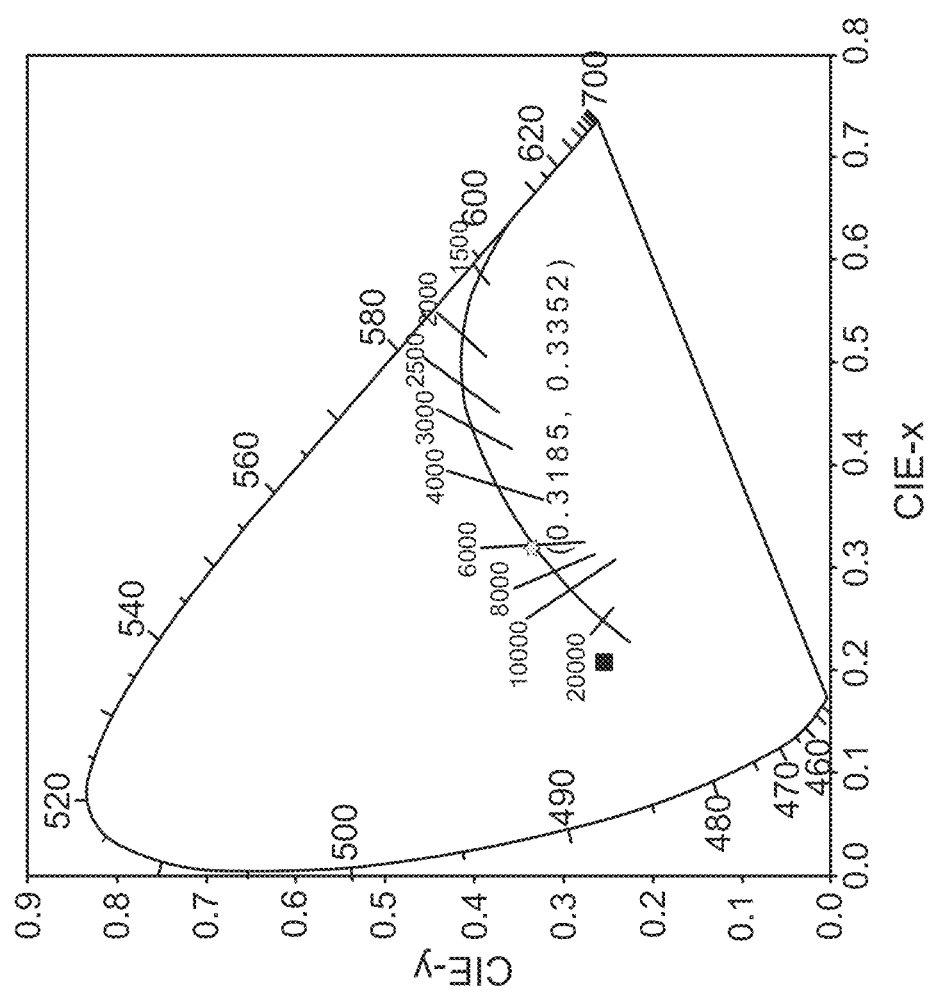
FIG. 15 shows a CIE 1931 chromaticity diagram.

Continuously referring to FIG. 14 and FIG. 15, wherein FIG. 14 shows a curve plot of wavelength versus photoluminescence (PL) intensity and FIG. 15 presents a CIE 1931 chromaticity diagram. From FIG. 14, it is easy to understand that the photoluminescent lights (red light and green light) radiated from the clusters of the light-diffusion quantum dot nanostructures 1 are almost equal to the UV light emitted by the LED chip 103 in luminous intensity. Such experimental data proves that the LED component 1a having the light-diffusion quantum dot nanostructures 1 performs better spatial light output distribution than the conventional QD-LED component's (as shown in FIG. 3). Moreover, it is worth noting that, the white light emitted by the LED component 1a having the light-diffusion quantum dot nanostructures 1 has a color temperature of 6000 K because the chromaticity coordinate of the white light is at (0.3185, 0.352). On the other hand, experimental data also show that, the luminous intensity of the white light emitted by the LED component 1a is greater than the luminous intensity of the white light radiated by the conventional QD-LED component's (as shown in FIG. 3) by about 15%.

Therefore, through above descriptions, the light-diffusion quantum dot nanostructure and the LED component having the light-diffusion quantum dot nanostructures proposed by the present invention have been introduced completely and clearly; in summary, the present invention includes the advantages of:

(1) The present invention discloses a light-diffusion quantum dot nanostructure 1 and an LED component 1a having the same. The quantum dot nanostructure 1 comprises an optical core 10, an organic ligand layer 11, a hydrophobic layer 12, an inorganic encapsulation layer 13, and a multi-layered water vapor barrier layer 14. In the present invention, the multi-layered water vapor barrier layer 14 is particularly designed to an onion skin-like structure, so as to facilitate photoluminescence rays radiated from the optical core 10 can emit out of the barrier layer 14 via voids or pores of the onion skin-like structure, such that the uniformity of the spatial light output distribution of the LED component 1a having the quantum dot nanostructures 1 can be obviously enhanced. On the other hand, because the multi-layered water vapor barrier layer 14 can also improve the dispersibility of the light-diffusion quantum dot nanostructures 1 in a colloidal encapsulation 104 of the LED component 1a, the luminous intensity of the LED component 1a is therefore increased.

The above description is made on embodiments of the present invention. However, the embodiments are not intended to limit scope of the present invention, and all equivalent implementations or alterations within the spirit of the present invention still fall within the scope of the present invention.

What is claimed is:

1. A light-diffusion quantum dot nanostructure with voids, comprising:
   an optical core;
   an organic ligand layer, being made of at least one organic ligand material and covering the optical core;
   a hydrophobic layer, being made of at least one hydrophobic material, wherein the hydrophobic material conjugates with the organic ligand material through facile ligand exchange reactions, so as to facilitate the hydrophobic layer cover the organic ligand layer;
   an inorganic encapsulation layer, covering the hydrophobic layer;
   a multi-layered water vapor barrier layer, covering the inorganic encapsulation layer, and constituted by a plurality of concentric spherical shells; and
   a plurality of voids, forming between the plurality of concentric spherical shells.

2. The light-diffusion quantum dot nanostructure with voids of claim 1, wherein the manufacturing material of the optical core is selected from the group consisting of Group II-VI compounds, Group III-V compounds, Group II-VI compounds having core-shell structure, Group III-V compounds having core-shell structure, Group II-VI compounds having non-spherical alloy structure, and combination of the aforesaid two or above compounds.

3. The light-diffusion quantum dot nanostructure with voids of claim 1, wherein the organic ligand material is selected from the group consisting of alkyl phosphines, phosphine oxides, phosphonic acids, organic compounds having thiol group, organic compounds having amine group, and carboxylic acids.

4. The light-diffusion quantum dot nanostructure with voids of claim 1, wherein the hydrophobic material is selected from the group consisting of 3-mercaptopropyltrimethoxysilane (3-MPS), 3-aminopropyltriethoxysilane (APTMS), 3-(trimethoxysilyl) propylmethacrylate (TMOPMA), and 3-trimethoxysilylpropanethiol (MPTMS).

5. The light-diffusion quantum dot nanostructure with voids of 1, wherein the manufacturing material of the inorganic encapsulation layer is selected from the group consisting of tetraethoxysilan (TEOS) and tetramethyl orthosilicate (TMOS).

6. The light-diffusion quantum dot nanostructure with voids of claim 1, wherein the manufacturing material of the concentric spherical shell is selected from the group consisting of silica gel, polysiloxane resin and metal oxide.

7. An LED component, comprising:
   an insulation body, being provided with a recess;
   a lead frame, being disposed in the insulation body and having at least two welding portions and at least two electrical connection portions, wherein the welding portions locate in the recess and the electrical connection portions extend out of the insulation body;
   an LED chip, being disposed in the recess and electrically connected to the welding portions, used for emitting a first colored light with a first wavelength;
   a colloidal encapsulation, being filled into the recess for enclosing the LED chip and the welding portions; and
   a plurality of clusters of light-diffusion quantum dot nanostructures with voids, being spread in the colloidal encapsulation, wherein each of the light-diffusion quantum dot nanostructures comprises:
   an optical core, being used for converting the first colored light to a second colored light with a second wavelength, wherein the second wavelength is longer than the first wavelength;
   an organic ligand layer, being made of at least one organic ligand material and covering the optical core;
   a hydrophobic layer, being made of at least one hydrophobic material, wherein the hydrophobic material conjugates with the organic ligand material through facile ligand exchange reactions, so as to facilitate the hydrophobic layer cover the organic ligand layer;
   an inorganic encapsulation layer, covering the hydrophobic layer;
   a multi-layered water vapor barrier layer, constituted by a plurality of concentric spherical shells, and covering the inorganic encapsulation layer; and
   a plurality of voids, forming between the plurality of concentric spherical shells.

8. The LED component of claim 7, further comprising a heat sink, being disposed in the insulation body and having an LED contacting portion and a heat dissipating portion; wherein the LED contacting portion locates in the recess for contacting the LED chip, and the heat dissipating portion extending out of the insulation body.

9. The LED component of claim 7, further comprising a lens, being disposed on the top of the insulation body for covering the recess.

10. The LED component of claim 7, wherein the manufacturing material of the colloidal encapsulation is selected from the group consisting of silicone, silica gel, polymethylmethacrylate (PMMA), polycarbonate (PC), polyvinyl chloride (PVC), polystyrene (PS), polyethylene terephthalate (PET), and epoxy resin.

11. The LED component of claim 7, wherein the first colored light is selected from the group consisting of ultraviolet light, purple-blue light, blue light, and combination of above two or more colored lights.

12. The LED component of claim 7, wherein the second colored light is selected from the group consisting of blue-green light, green light, yellow light, orange light, red light, and combination of above two or more colored lights.

13. The LED component of claim 7, wherein the optical core has particle size in a range selected from the group consisting of 2-7 nm, 3-10 nm, 4-12 nm, 4-14 nm, and 5-20 nm.

14. The LED component of claim 7, wherein the manufacturing material of the optical core is selected from the group consisting of Group II-VI compounds, Group III-V compounds, Group II-VI compounds having core-shell structure, Group III-V compounds having core-shell structure, Group II-VI compounds having non-spherical alloy structure, and combination of the aforesaid two or above compounds.

15. The LED component of claim 7, wherein the organic ligand material is selected from the group consisting of alkyl phosphines, phosphine oxides, phosphonic acids, organic compounds having thiol group, organic compounds having amine group, and carboxylic acids.

16. The LED component of claim 7, wherein the hydrophobic material is one kind of silicon-based monomer selected from the group consisting of 3-mercaptopropylt-rimethoxysilane (3-MPS), 3-aminopropyltriethoxysilane (APTMS), 3-(trimethoxysilyl) propylmethacrylate (TMOPMA), and 3-trimethoxysilylpropanethiol (MPTMS).

17. The LED component of claim 7, wherein the manufacturing material of the inorganic encapsulation layer is selected from the group consisting of tetraethoxysilan (TEOS) and tetramethyl orthosilicate (TMOS).

18. The LED component of claim 7, wherein the manufacturing material of the concentric spherical shell is selected from the group consisting of silica gel, polysiloxane resin and metal oxide.

\* \* \* \* \*